United States Patent
JangJian et al.

(10) Patent No.: US 9,219,092 B2
(45) Date of Patent: *Dec. 22, 2015

(54) GRIDS IN BACKSIDE ILLUMINATION IMAGE SENSOR CHIPS AND METHODS FOR FORMING THE SAME

(75) Inventors: Shiu-Ko JangJian, Tainan (TW); Szu-An Wu, Tainan (TW); Sheng-Wen Chen, Shinjuang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 237 days.

This patent is subject to a terminal disclaimer.

(21) Appl. No.: 13/396,426

(22) Filed: Feb. 14, 2012

(65) Prior Publication Data

US 2013/0207213 A1    Aug. 15, 2013

(51) Int. Cl.
*H01L 31/0232* (2014.01)
*H01L 27/146* (2006.01)

(52) U.S. Cl.
CPC ...... *H01L 27/14632* (2013.01); *H01L 27/1464* (2013.01); *H01L 27/14687* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 8,039,883 B2 * | 10/2011 | Kohyama | 257/292 |
| 8,216,873 B2 | 7/2012 | Uya | |
| 8,233,066 B2 | 7/2012 | Zheng et al. | |
| 8,445,985 B2 | 5/2013 | Hiyama et al. | |
| 8,507,964 B2 | 8/2013 | Nozaki et al. | |
| 8,508,634 B2 | 8/2013 | Oshiyama et al. | |
| 8,670,054 B2 | 3/2014 | Takizawa | |
| 2009/0101192 A1 * | 4/2009 | Kothari et al. | 136/246 |
| 2010/0110271 A1 * | 5/2010 | Yanagita et al. | 348/340 |
| 2012/0147208 A1 * | 6/2012 | Otsuka et al. | 348/222.1 |
| 2013/0119238 A1 | 5/2013 | Yamashita | |
| 2013/0241018 A1 * | 9/2013 | JangJian et al. | 257/432 |

FOREIGN PATENT DOCUMENTS

| | | |
|---|---|---|
| JP | 2008034684 | 2/2008 |
| JP | 2008311413 | 12/2008 |
| JP | 2011035204 | 2/2011 |
| JP | 2011216623 | 10/2011 |
| TW | 201114023 | 7/1999 |
| TW | 201001683 | 1/2010 |
| TW | 201130124 | 9/2011 |
| TW | 201143415 | 12/2011 |

* cited by examiner

*Primary Examiner* — Matthew W Such
*Assistant Examiner* — Abul Kalam
(74) *Attorney, Agent, or Firm* — Slater & Matsil, L.L.P.

(57) ABSTRACT

A device includes a semiconductor substrate, which has a front side and a backside. A photo-sensitive device is disposed on the front side of the semiconductor substrate. A first and a second grid line are parallel to each other, and are disposed on the backside of, and overlying, the semiconductor substrate. A stacked layer includes an adhesion layer, a metal layer over the adhesion layer, and a high-refractive index layer over the metal layer. The adhesion layer, the metal layer, and the high-refractive index layer are substantially conformal, and extend on top surfaces and sidewalls of the first and the second grid lines.

20 Claims, 7 Drawing Sheets

GRIDS IN BACKSIDE ILLUMINATION IMAGE SENSOR CHIPS AND METHODS FOR FORMING THE SAME

BACKGROUND

Backside Illumination (BSI) image sensor chips are replacing front-side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip.

The image sensors in the BSI image sensor chips generate electrical signals in response to the stimulation of photons. The magnitudes of the electrical signals (such as the currents) depend on the intensity of the incident light received by the respective image sensors. To reduce the optical cross-talks of the light received by different image sensors, metal grids are formed to isolate the light. To maximize the quantum efficiency of image sensors, it is desirable that the light loss and optical cross-talk are minimized.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A grid structure in a Backside Illumination (BSI) image sensor chip and the methods of forming the same are provided in accordance with various exemplary embodiments. The intermediate stages of forming the grid structure are illustrated. The variations of the embodiments are discussed. Throughout the various views and illustrative embodiments, like reference numbers are used to designate like elements.

Figure 1:
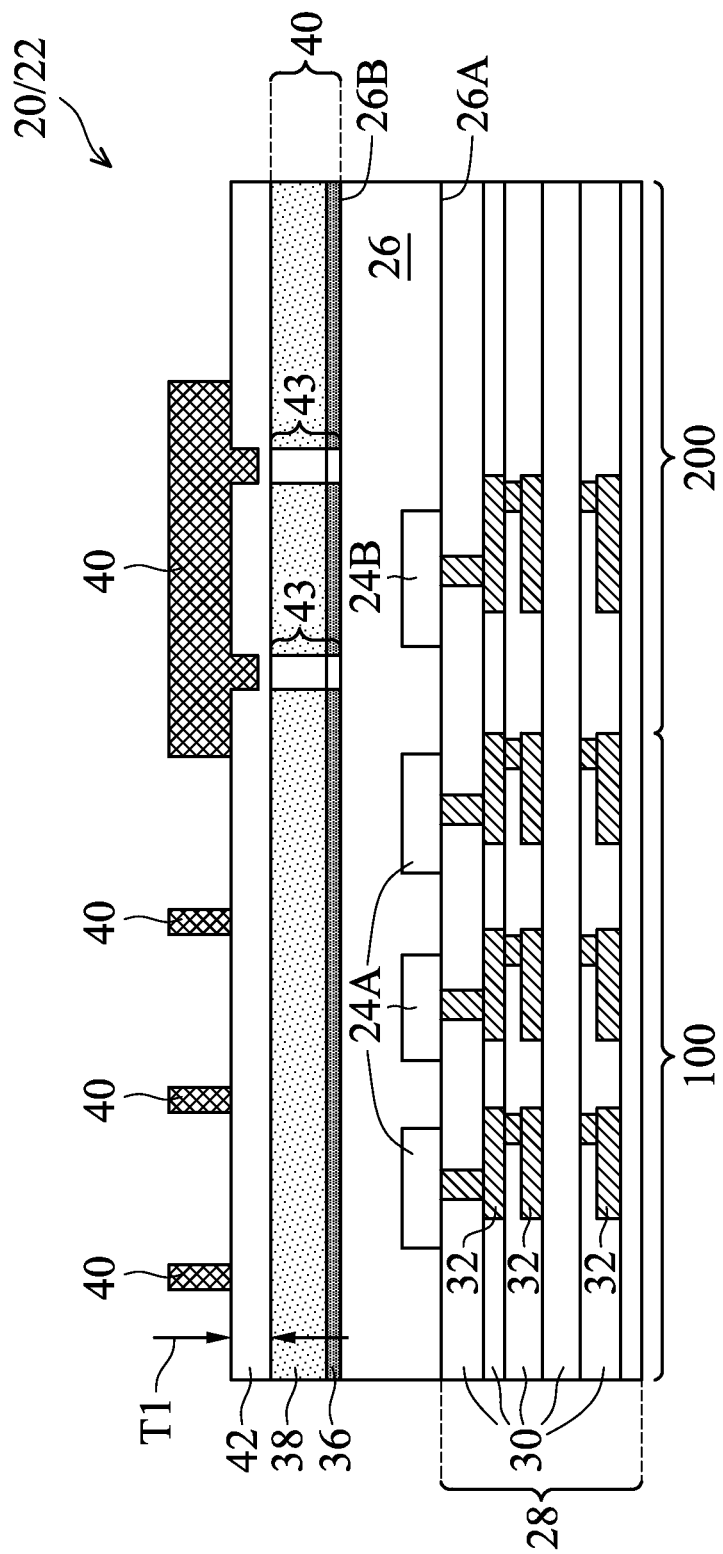
FIGS. 1 through 6 are cross-sectional views of intermediate stages in the manufacturing of a grid structure in a Backside Illumination (BSI) image sensor chip in accordance with some exemplary embodiments.

FIGS. 1 through 6 illustrate the cross-sectional views of intermediate stages in the manufacturing of a grid structure in accordance with some exemplary embodiments. FIG. 1 illustrates image sensor chip 20, which may be a part of an unsawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 (including 24A and 24B) are formed at surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, the respective wafer 22 may be an image sensor wafer. In some exemplary embodiments, image sensors 24 extend from front surface 26A into semiconductor substrate 26. The structures of image sensors 24A and 24B may be identical to each other.

Front-side interconnect structure 28 is formed over semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, the metal lines 32 in a same dielectric layer 30 are collectively referred to as being a metal layer. Front-side interconnect structure 28 may include a plurality of metal layers. In some exemplary embodiments, dielectric layers 30 include low-k dielectric layers and passivation layers. The low-k dielectric layers have low k values, for example, lower than about 3.0. The passivation layers may be formed of non-low-k dielectric materials having k values greater than 3.9. In some embodiments, the passivation layers include a silicon oxide layer and a silicon nitride layer on the silicon oxide layer.

Image sensor chip 20 includes active image sensor pixel region 100 and black reference pixel region 200. Active image sensor pixel region 100 includes active image sensors 24A formed therein, which are used for generating electrical signals from the sensed light. Image sensors 24A may form an active image sensor pixel array including a plurality of image sensors arranged as rows and columns. Black reference pixel region 200 includes black reference image sensor 24B formed therein, which is used for generating reference black level signals. Although one image sensor 24B is illustrated, there may be a plurality of image sensors 24B.

A backside grinding is performed to thin semiconductor substrate 26, and the thickness of wafer 22 is reduced to smaller than about 30 μm, or smaller than about 5 μm, for example. With semiconductor substrate 26 having a small thickness, light can penetrate from back surface 26B into semiconductor substrate 26, and reach image sensors 24A.

After the step of thinning, buffer layers 40 are formed on the surface of semiconductor substrate 26. In some exemplary embodiments, buffer layers 40 include Bottom Anti-Reflective Coating (BARC) 36, and silicon oxide layer 38 over BARC layer 36. It is appreciated that buffer layers 40 may have different structures, and may have different number of layers other than illustrated.

Grid layer 42 is formed over buffer layers 40. In some embodiments, grid layer 42 comprises a metal(s) or a metal alloy, wherein the metals in grid layer 42 include tungsten, aluminum, copper, and the like. In alternative embodiments, grid layer 42 may be a ceramic layer. Grid layer 42 may also be formed of partially transparent material, and may be a conductive layer or a dielectric layer. Thickness T1 of grid layer 42 may be greater than about 500 Å, for example. It is appreciated that the dimensions recited throughout the description are merely examples, and may be changed to different values. Photo resist 44 is formed over grid layer 42, and is then patterned.

Figure 2:
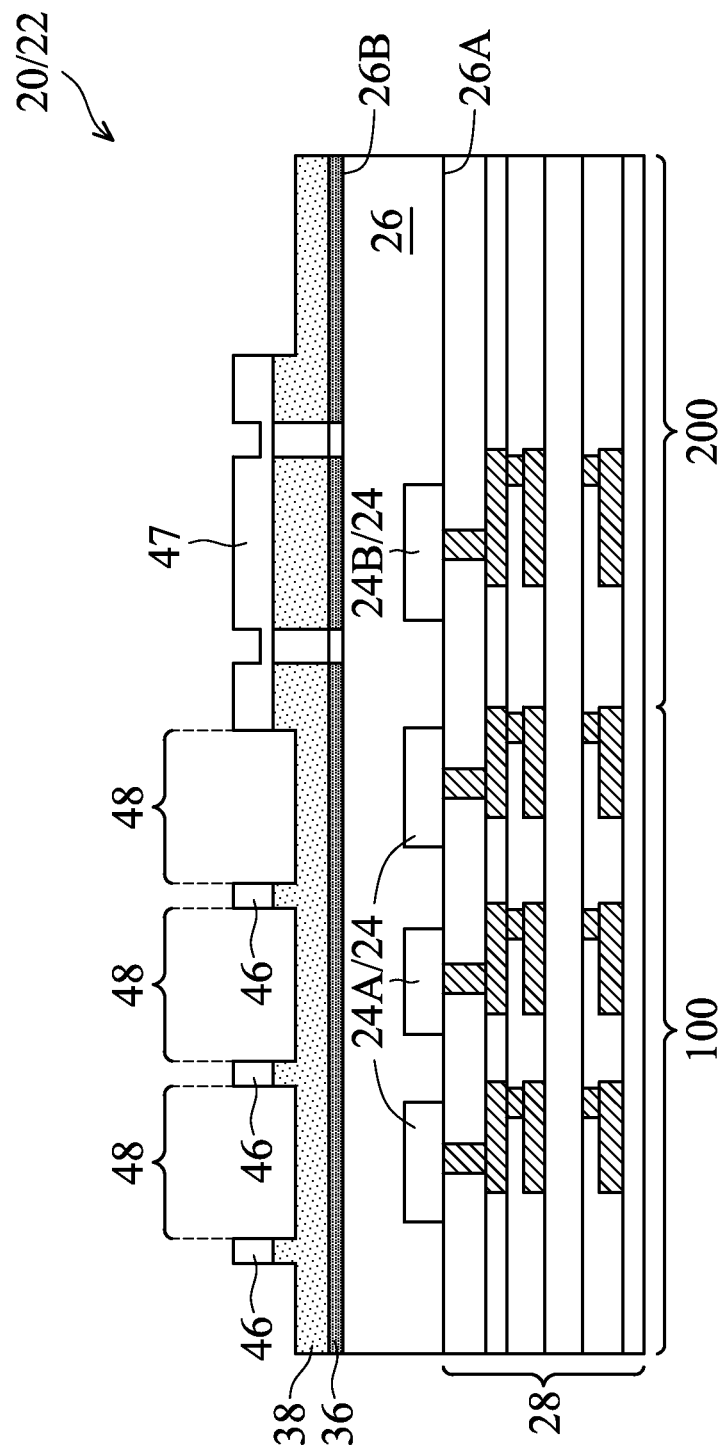

The patterned photo resist 44 is used as an etching mask to etch through grid layer 42. Referring to FIG. 2, the remaining portions of grid layer 42 form grid lines 46, which have lengthwise directions parallel to surface 26A of substrate 26. Grid lines 46 include a first plurality of grid lines parallel to each other, and a second plurality of grid lines parallel to each other. The first plurality of grid lines is perpendicular to the second plurality of grid lines 46 to form the grids. Grid openings 48 are formed between grid lines 46. Each of grid openings 48 may be over and aligned to one of active image sensors 24A. The patterned grid layer 42 further includes portion 47 over and aligned to black reference image sensor 24B. Portion 47 is referred to as optical shield 47 hereinafter, which may be a metal shield or a ceramic shield.

Figure 3:
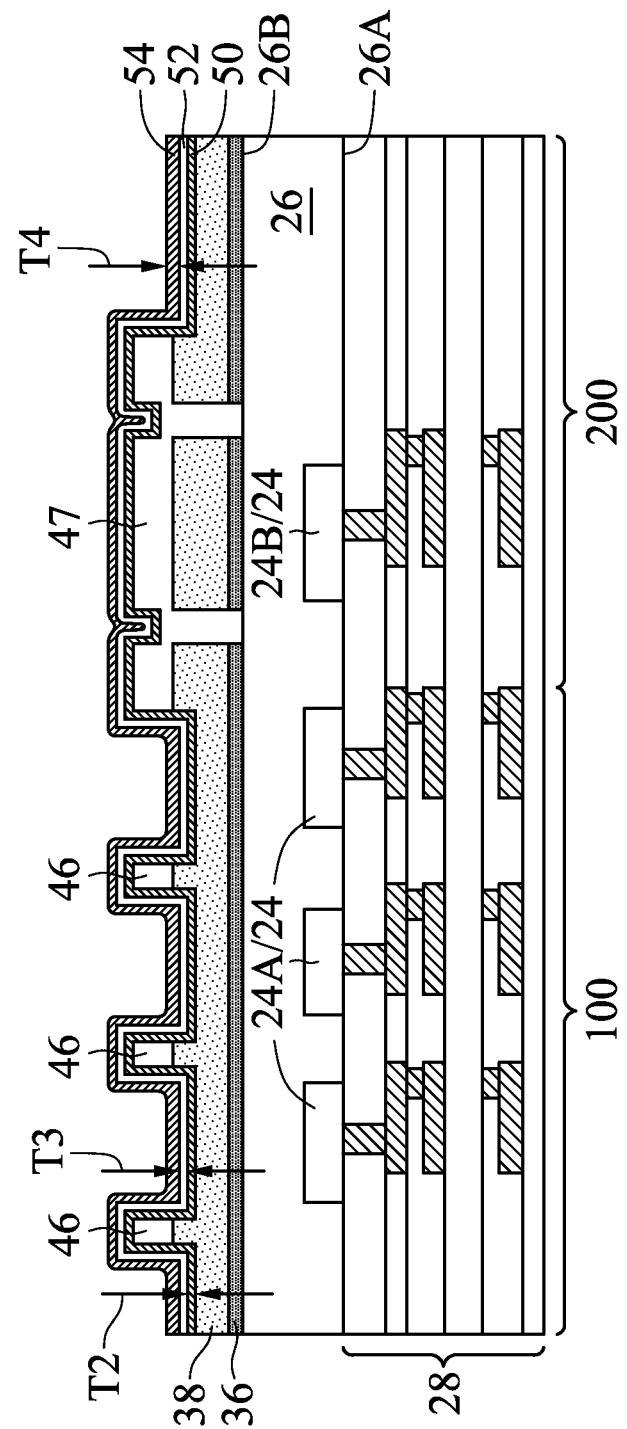
Figure 4:
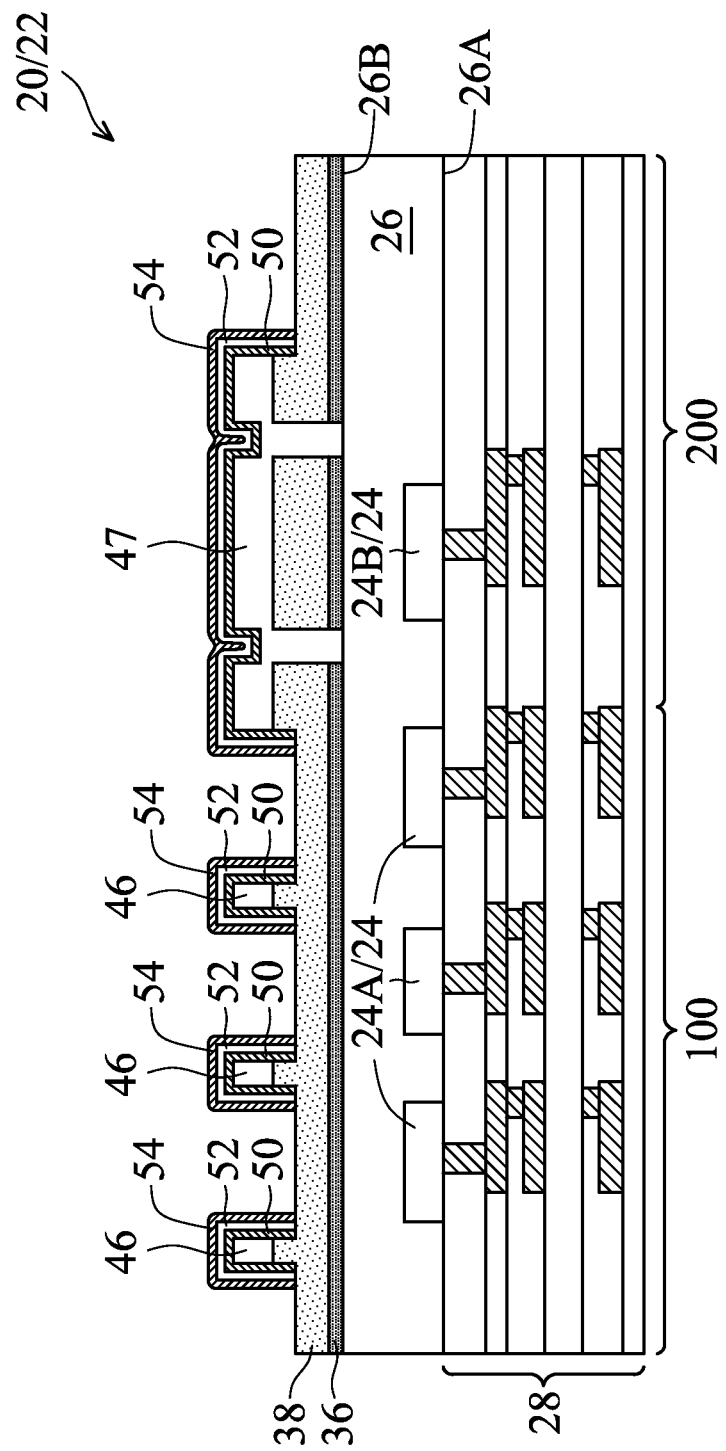

FIGS. 3 and 4 illustrate the formation of a coating on grid lines 46, wherein the coating includes stacked layers. Referring to FIG. 3, adhesion layer 50, metal reflective layer 52, and high-refractive index layer 54 are formed. Each of layers 50, 52, and 54 may be a substantially conformal layer, with the vertical portions have substantially the same thicknesses as the horizontal portions of the respective layers. In some embodiments, adhesion layer 50 is a chromium layer, although other materials that can improve the adhesion between metal reflective layer 52 and grid lines 46 can be used. Thickness T2 of adhesion layer 50 may be between about 50 Å and about 200 Å in some exemplary embodiments. Metal reflective layer 52 may be a silver layer, which may be formed of substantially pure silver, for example, with the silver percentage greater than about 95 percent, or greater than about 99 percent. In alternative embodiments, metal reflective layer 52 may be an aluminum layer, which may be formed of substantially pure aluminum, for example, with the aluminum percentage greater than about 95 percent, or greater than about 99 percent. Thickness T3 of metal reflective layer 52 may be smaller than about 1,000 Å, and may be smaller than about 500 Å in some exemplary embodiments. It is noted that although metal layers with thicknesses lower than about 1,000 Å may be partially transparent, with the structures in accordance with embodiments, there is a near-perfect reflection of light on the surface of metal reflective layer 52, and hence the small thickness T3 does not adversely cause the optical cross-talk between different grids.

High-refractive index layer 54 may have a refractive index (n value) greater than about 1.5, or greater than about 2.0. In some embodiments, high-refractive index layer 54 is formed of silicon-rich oxide, which has a refractive index greater than about 1.5. The adjustment of the refractive index into the desirable range may be achieved by increasing the silicon percentage in high-refractive index layer 54. In alternative embodiments, high-refractive index layer 54 comprises a high-k dielectric material, which has a refractive index greater than 2.0. The exemplary high-k dielectric materials include hafnium oxide, lanthanum oxide, tantalum oxide, and combinations thereof. Thickness T4 of high-refractive index layer 54 may be between about 100 Å and about 1,000 Å, for example.

Referring to FIG. 4, adhesion layer 50, metal reflective layer 52, and high-refractive index layer 54 are patterned. The remaining portions of layers 50, 52, and 54 include first portions on the top surfaces and sidewalls of grid lines 46, and a second portion in black reference pixel region 200. The second portion may further include a top portion over optical shield 47, and sidewall portions on the sidewalls of optical shield 47. The horizontal portions of layers 50, 52, and 54 that are aligned to active image sensors 24A are removed.

Figure 5:
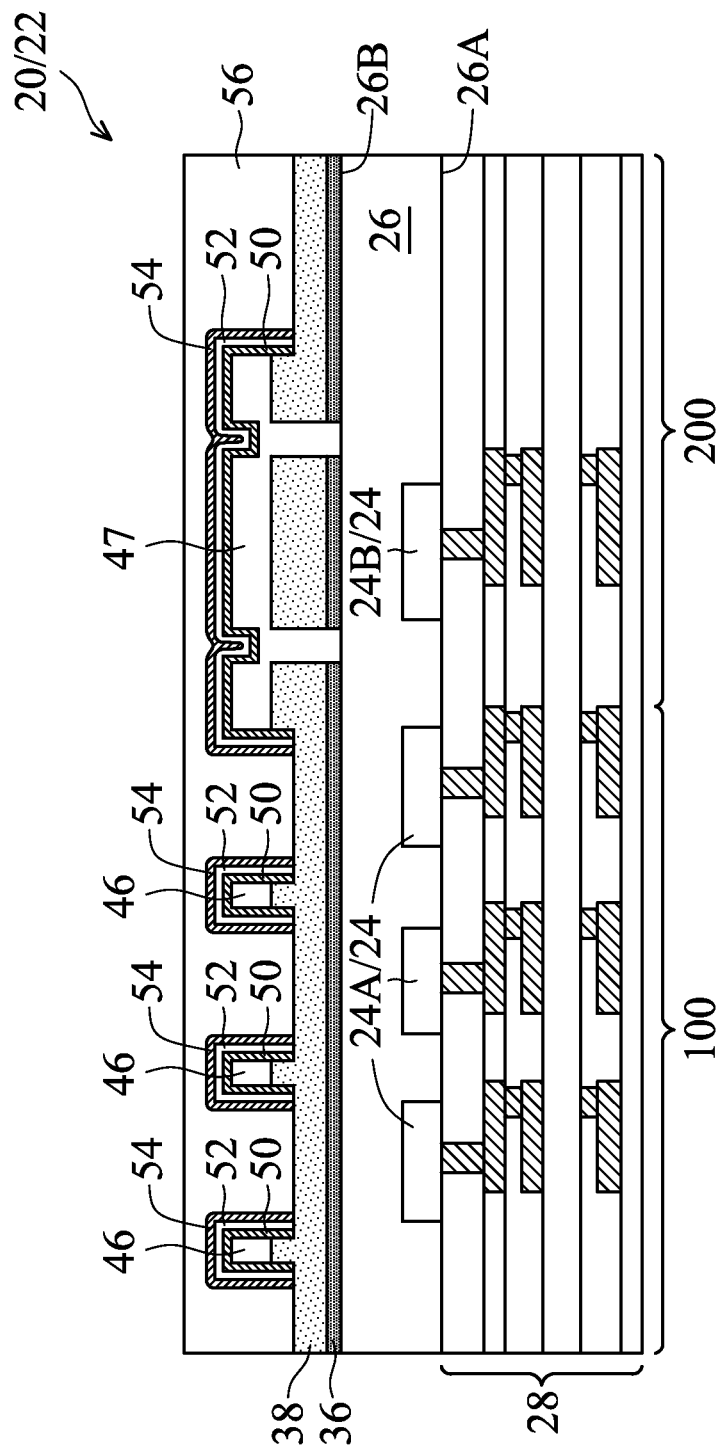
Figure 6:
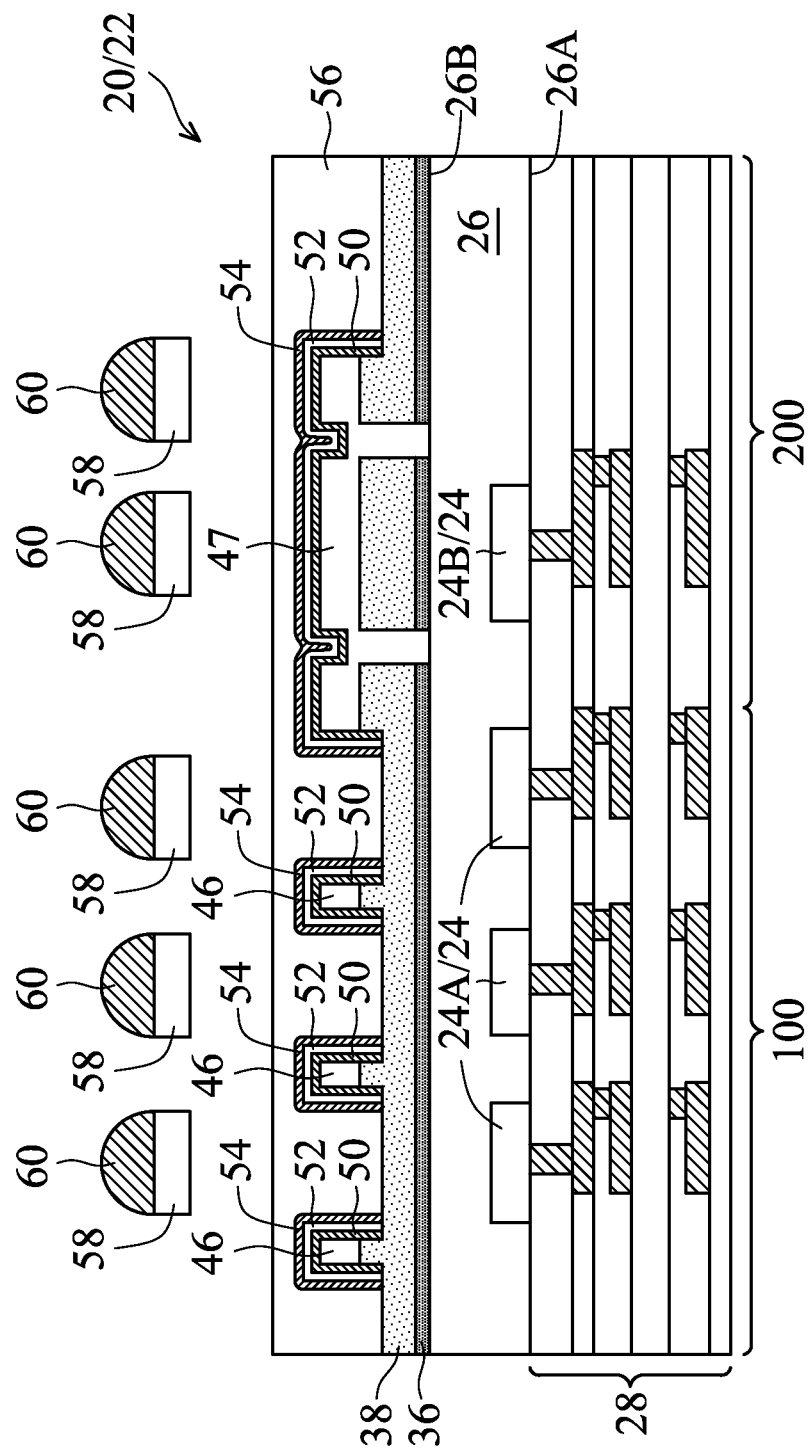

FIG. 5 illustrates the formation of oxide layer 56, which may be a silicon oxide layer formed using Plasma Enhanced Chemical Vapor Deposition (PECVD). In some embodiments, a planarization step such as a Chemical Mechanical Polish (CMP) is performed to level the top surface of oxide layer 56. Oxide layer 56 fills grid openings 48, and may further include portions over grid lines 46. In subsequent process steps, as shown in FIG. 6, additional components such as color filters 58 and micro-lenses 60 are formed, with each of color filters 58 and micro-lenses 60 aligned to one of active image sensors 24A. In some embodiments, oxide layer 56 has a refractive index smaller than the refractive index of high-refractive index layer 54. The difference between the refractive index of high-refractive index layer 54 and oxide layer 56 may be greater than about 0.5, for example. The refractive index of oxide layer 56 may also be lower than 1.5.

Figure 7:
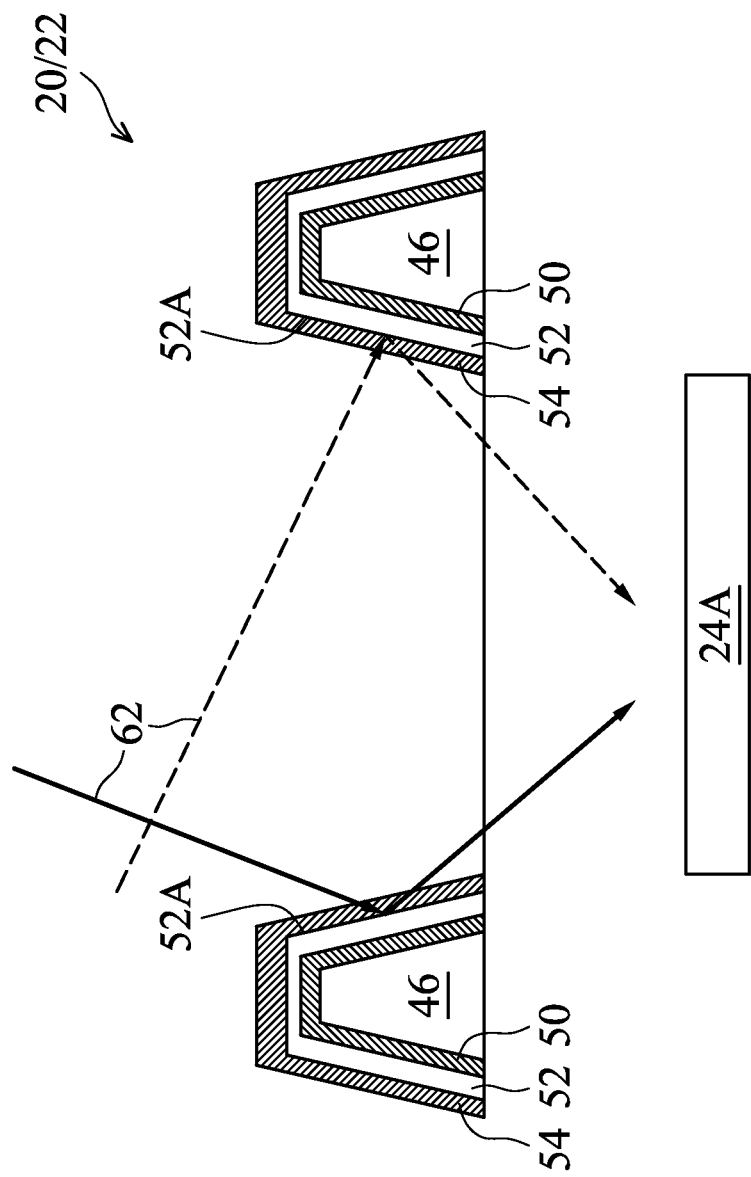
FIG. 7 schematically illustrates the light paths on the grid structure.

FIG. 7 illustrates an amplified view of grid lines 46 and the overlying layers 50, 52, and 54. Arrows 62 represent exemplary light directions. Surfaces 52A of metal reflective layer 52 reflect light 62. In some embodiments, the reflectivity is greater than 95 percent, and may be greater than 98 percent. Accordingly, there is a great amount of light reflected and received by the respective active image sensors 24A. The quantum efficiency is thus improved. Furthermore, with more light being reflected on the surfaces of metal reflective layer 52, less light may penetrate through grid lines 46 to reach neighboring grids. The optical cross-talk is thus reduced, and the signal-to-noise ratio is increased.

Referring back to FIG. 6, layers 50, 52, and 54 are also formed in black reference pixel region 200. Accordingly, layers 50, 52, and 54 and the underlying optical shield 47 has improved ability for preventing light to penetrate through.

In accordance with embodiments, a device includes a semiconductor substrate, which has a front side and a backside. A photo-sensitive device is disposed on the front side of the semiconductor substrate. A first and a second grid line are parallel to each other, and are disposed on the backside of, and overlying, the semiconductor substrate. A stacked layer includes an adhesion layer, a metal layer over the adhesion layer, and a high-refractive index layer over the metal layer. The adhesion layer, the metal layer, and the high-refractive index layer are substantially conformal, and extend on top surfaces and sidewalls of the first and the second grid lines.

In accordance with other embodiments, a device includes a semiconductor substrate having a front side and a backside. A plurality of grid lines is disposed on the backside of the semiconductor substrate and forming a plurality of grids. A plurality of photo-sensitive devices is underlying and aligned to grid openings between the plurality of grid lines. The plurality of photo-sensitive devices is at the front side of the semiconductor substrate, and is configured to receive light from the backside of the semiconductor substrate, and convert the light to an electrical signal. A chromium layer includes top surface portions on top surfaces of the plurality of grid lines, and sidewall portions on sidewalls of the plurality of grid lines. A silver layer includes top surface portions and sidewall portions on the top surface portions and the sidewall portions, respectively, of the chromium layer. A high-refractive index layer includes top surface portions and sidewall portions on the top surface portions and the sidewall portions, respectively, of the silver layer.

In accordance with yet other embodiments, a method includes forming a plurality of photo-sensitive devices on a front side of a semiconductor substrate, forming a grid layer on a backside of the semiconductor substrate, and patterning the grid layer to form a plurality of grid lines. Grid openings between the plurality of grid lines are aligned to the plurality of photo-sensitive devices. A stacked layer is formed on top surfaces and sidewalls of the plurality of grid lines, wherein the step of forming the stacked layer includes forming an adhesion layer, forming a metal layer over the adhesion layer, and forming a high-refractive index layer over the metal layer. The stacked layer is patterned to remove the portions of the stacked layer that are aligned to the plurality of photo-sensitive devices.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having a front side and a backside;
    a first photo-sensitive device disposed on the front side of the semiconductor substrate;
    a first and a second grid line parallel to each other, wherein the first and the second grid lines are on the backside of, and overlying, the semiconductor substrate;
    an adhesion layer;
    a metal layer over the adhesion layer; and
    a high-refractive index layer over the metal layer, wherein the adhesion layer, the metal layer, and the high-refractive index layer are substantially conformal, and extend on top surfaces and sidewalls of the first and the second grid lines.

2. The device of claim 1, wherein the first photo-sensitive device is underlying and aligned to a space between the first and the second grid lines, and wherein the adhesion layer, the metal layer, and the high-refractive index layer are free from portions over and aligned to the first photo-sensitive device.

3. The device of claim 1, wherein the adhesion layer comprises chromium.

4. The device of claim 1, wherein the metal layer comprises silver.

5. The device of claim 1, wherein the first and the second grid lines comprise a ceramic.

6. The device of claim 1, wherein the high-refractive index layer comprises silicon oxide, and has a refractive index greater than 1.5.

7. The device of claim 1, wherein the high-refractive index layer comprises a high-k dielectric material, and has a refractive index greater than about 2.0.

8. The device of claim 1 further comprising:
    a second image sensor disposed on the front side of the semiconductor substrate; and
    an optical shielding layer over and aligned to the second image sensor, wherein the optical shielding layer is formed of a same material as, and is at substantially a same level as, the first and the second grid lines, and wherein the adhesion layer, the metal layer, and the high-refractive index layer extend on a top surface of the optical shielding layer.

9. A device comprising:
    a semiconductor substrate having a front side and a backside;
    a plurality of grid lines on the backside of the semiconductor substrate and forming a plurality of grids;
    a plurality of photo-sensitive devices underlying and aligned to grid openings between the plurality of grid lines, wherein the plurality of photo-sensitive devices is at the front side of the semiconductor substrate, and is configured to receive light from the backside of the semiconductor substrate and convert the light to an electrical signal;
    a chromium layer comprising top surface portions on top surfaces of the plurality of grid lines, and sidewall portions on sidewalls of the plurality of grid lines;
    a silver layer comprising top surface portions and sidewall portions on the top surface portions and the sidewall portions, respectively, of the chromium layer; and
    a high-refractive index layer comprising top surface portions and sidewall portions on the top surface portions and the sidewall portions, respectively, of the silver layer.

10. The device of claim 9, wherein the chromium layer, the silver layer, and the high-refractive index layer are substantially conformal layers.

11. The device of claim 9, wherein the chromium layer, the silver layer, and the high-refractive index layer do not comprise portions aligned to the plurality of photo-sensitive devices.

12. The device of claim 9, wherein the plurality of grid lines is metal lines.

13. The device of claim 9, wherein the plurality of grid lines is ceramic lines.

14. The device of claim 9 further comprising:
    an image sensor disposed on the front side of the semiconductor substrate; and
    an optical shielding layer over and aligned to the image sensor, wherein the optical shielding layer is formed of a same material as, and is at substantially a same level as, the plurality of grid lines, and wherein the chromium layer, the silver layer, and the high-refractive index layer extend on a top surface and sidewalls of the optical shielding layer.

15. A device comprising:
    a semiconductor substrate;
    a photo-sensitive device on a first side of the semiconductor substrate;
    a first grid line and a second grid line parallel to each other;
    a third grid line and a fourth grid line parallel to each other and perpendicular to the first grid line and the second grid line, wherein a space defined by the first grid line, the second grid line, the third grid line, and the fourth grid line is aligned with the photo-sensitive device, and the first grid line, the second grid line, the third grid line, and the fourth grid line are on a second side of the semiconductor substrate opposite to the first side;
    an adhesion layer extending on a top surface and sidewalls of each of the first grid line, the second grid line, the third grid line, and the fourth grid line;
    a metal layer over the adhesion layer, wherein the metal layer comprises a top portion over a top surface portion of the adhesion layer, and sidewall portions on sidewalls of the adhesion layer;
    a high-refractive index layer over the metal layer; and
    an oxide layer filling a space between the first grid line and the second line, wherein the space is further between the third grid line and the fourth grid line.

16. The device of claim 15, wherein the adhesion layer is a substantially conformal layer.

17. The device of claim 15, wherein the oxide layer comprises a portion level with the adhesion layer.

18. The device of claim 15, wherein the high-refractive index layer comprises silicon oxide, and has a refractive index greater than about 1.5.

19. The device of claim 15, wherein the high-refractive index layer comprises a high-k dielectric material, and has a refractive index greater than about 2.0.

20. The device of claim 15, wherein the adhesion layer comprises chromium, and the metal layer comprises silver.

* * * * *